(12) United States Patent
Kafuku et al.

(10) Patent No.: US 9,956,654 B2
(45) Date of Patent: May 1, 2018

(54) METHOD FOR MANUFACTURING HEAT EXCHANGER, AND HEAT EXCHANGER

(71) Applicant: DENSO CORPORATION, Kariya, Aichi-pref. (JP)

(72) Inventors: Kazuaki Kafuku, Chiryu (JP); Isao Kuroyanagi, Anjo (JP); Yasutoshi Yamanaka, Kariya (JP); Ryonosuke Tera, Kariya (JP); Yukihiro Sano, Gamagori (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 158 days.

(21) Appl. No.: 14/780,994

(22) PCT Filed: Mar. 27, 2014

(86) PCT No.: PCT/JP2014/001778
§ 371 (c)(1),
(2) Date: Sep. 28, 2015

(87) PCT Pub. No.: WO2014/162700
PCT Pub. Date: Oct. 9, 2014

(65) Prior Publication Data
US 2016/0039056 A1 Feb. 11, 2016

(30) Foreign Application Priority Data
Apr. 3, 2013 (JP) .................. 2013-077625

(51) Int. Cl.
*B23P 15/26* (2006.01)
*F28F 3/02* (2006.01)
(Continued)

(52) U.S. Cl.
CPC ............ *B23P 15/26* (2013.01); *C23C 16/405* (2013.01); *C23C 16/45555* (2013.01);
(Continued)

(58) Field of Classification Search
CPC . B23P 15/26; C23C 16/45555; C23C 16/405; F28D 9/0062; F28D 7/1684; F28F 3/027; F28F 2275/04
See application file for complete search history.

(56) References Cited

U.S. PATENT DOCUMENTS

2003/0118843 A1   6/2003   Reiss et al.
2004/0244686 A1   12/2004   Cho et al.
(Continued)

FOREIGN PATENT DOCUMENTS

JP   S60297767 A   5/1987
JP   S62151555 A   7/1987
(Continued)

OTHER PUBLICATIONS

International Search Report and Written Opinion (in Japanese with English Translation) for PCT/JP2014/001778, dated Jul. 1, 2014; ISA/JP.

*Primary Examiner* — John C Hong
(74) *Attorney, Agent, or Firm* — Harness, Dickey & Pierce, P.L.C.

(57) ABSTRACT

A method for manufacturing a heat exchanger includes: assembling a plurality of heat exchanger components in an assembly step; and forming a film on surfaces of the heat exchanger components using a chemical vapor deposition method in a film formation step after the assembly step. The film can restrict a formation of a through hole due to corrosion. The film can be restricted from being damaged at a delivery or assembling time, because the film formation step is provided after the assembly step. An occurrence of clogging can be restricted at a minute portion inside of the heat exchanger in the film formation step, because the film is formed using the chemical vapor deposition method.

6 Claims, 10 Drawing Sheets

(51) Int. Cl.
*F28D 7/16* (2006.01)
*F28D 9/00* (2006.01)
*C23C 16/40* (2006.01)
*C23C 16/455* (2006.01)

(52) U.S. Cl.
CPC ......... *F28D 7/1684* (2013.01); *F28D 9/0062* (2013.01); *F28F 3/027* (2013.01); *F28F 2275/04* (2013.01)

(56) References Cited

U.S. PATENT DOCUMENTS

| | | |
|---|---|---|
| 2006/0275926 A1 | 12/2006 | Carcia et al. |
| 2007/0275181 A1 | 11/2007 | Carcia et al. |
| 2008/0011464 A1 | 1/2008 | Oofune et al. |
| 2008/0182101 A1 | 7/2008 | Carcia et al. |
| 2011/0247318 A1 | 10/2011 | Kuroyanagi et al. |

FOREIGN PATENT DOCUMENTS

| | | | |
|---|---|---|---|
| JP | H01178152 A | | 7/1989 |
| JP | H04168706 A | | 6/1992 |
| JP | H04356695 A | | 12/1992 |
| JP | H08097034 A | | 4/1996 |
| JP | H10274401 A | | 10/1998 |
| JP | 2000309880 | * | 7/2000 |
| JP | 2001280879 A | | 10/2001 |
| JP | 2003535221 A | | 11/2003 |
| JP | 2005043011 A | | 2/2005 |
| JP | 2005520050 A | | 7/2005 |
| JP | 2006037158 A | | 2/2006 |
| JP | 2007123530 A | | 5/2007 |
| JP | 2007194168 A | | 8/2007 |
| JP | 2007529624 A | | 10/2007 |
| JP | 2008039380 A | | 2/2008 |
| JP | 2008249273 A | | 10/2008 |
| JP | 2011232020 A | | 11/2011 |
| JP | 2012184509 A | | 9/2012 |

* cited by examiner

EXHAUST GAS

METHOD FOR MANUFACTURING HEAT EXCHANGER, AND HEAT EXCHANGER

CROSS REFERENCE TO RELATED APPLICATIONS

This application is a U.S. National Phase Application under 35 U.S.C. 371 of International Application No. PCT/JP2014/001778 filed on Mar. 27, 2014 and published in Japanese as WO 2014/162700 A1 on Oct. 9, 2014. This application is based on and claims the benefit of priority from Japanese Patent Application No. 2013-077625 filed on Apr. 3, 2013. The entire disclosures of all of the above applications are incorporated herein by reference.

TECHNICAL FIELD

The present disclosure relates to a method for manufacturing a heat exchanger, and a heat exchanger.

BACKGROUND ART

An exhaust gas heat exchanger is known (for example, refer to PTL 1) in which exhaust gas is cooled by carrying out an exchange of heat between exhaust gas generated by combustion and a cooling medium. This kind of exhaust gas heat exchanger includes an inner fin joined to the inside of a tube through which exhaust gas flows, and is configured so as to cool the exhaust gas by exchanging heat between the exhaust gas flowing inside the tube and a cooling water flowing on the outer side of the tube.

PRIOR ART LITERATURES

Patent Literature

PTL 1: JP 2008-39380 A

SUMMARY OF INVENTION

It is necessary to secure corrosion resistance with respect to condensed water for the exhaust gas heat exchanger. Consequently, a material with high corrosion resistance (for example, a stainless steel containing chromium at the maximum) is used as the material of components of the exhaust gas heat exchanger. Thus, the material cost increases.

In response to this, a method is conceivable in which the corrosion resistance of the tube is secured by performing a plating process on the inner wall surface (the surface in contact with the exhaust gas) of the tube and the inner fin. However, the plating process causes the thickness of the plating film to be large. Further, when performing a plating process on a heat exchanger structure including components such as the tube and the inner fin, there is concern that minute portions (for example, the inner fin) inside the heat exchanger structure may be blocked, because the plating film is formed using a liquid-state metal. Because of this, employing this method is difficult.

Another method is also conceivable in which the components (the tube and the inner fin) are assembled after a plating process is performed on the components before assembly. However, there is a possibility of the plating film being damaged when conveying the components or when assembling the components, so employing this method is also difficult. In particular, when joining the components by brazing after assembling the components, the plating film is melted by the brazing.

An object of the disclosure is to provide a method for manufacturing a heat exchanger and a heat exchanger such that the occurrence of a through hole due to corrosion (pitting) can be reliably restricted.

According to an aspect of the present disclosure, a method for manufacturing a heat exchanger includes: assembling a plurality of heat exchanger components in an assembly step; and forming a film on surfaces of the heat exchanger components using a chemical vapor deposition method in a film formation step after the assembly step.

Accordingly, the occurrence of a through hole due to corrosion in the heat exchanger components can be restricted by the film being formed on the surfaces of the heat exchanger components. As the film formation step is carried out after the assembly step, the film can be prevented from being damaged when conveying the components or when assembling the components. Furthermore, by the film being formed on the surfaces of the heat exchanger components using a chemical vapor deposition method, which is one kind of dry coating method, a minute portion inside the heat exchanger can be prevented from being blocked and clogged when carrying out the film formation step. Consequently, the occurrence of a through hole due to corrosion in the heat exchanger components can be reliably restricted.

The method for manufacturing a heat exchanger may further include a brazing step, carried out after the assembly step, of brazing the plurality of heat exchanger components, and the film formation step is carried out after the brazing step.

Accordingly, the film can be prevented from melting when brazing, because the film formation step is carried out after the brazing step. Thus, the film can be more reliably formed on the surfaces of the heat exchanger components.

In the present disclosure, "carried out after the brazing step" means to include a case where the film formation step is carried out simultaneously with cooling of the brazed heat exchanger components after the heat exchanger components are brazed.

DESCRIPTION OF EMBODIMENTS

Figure 1:
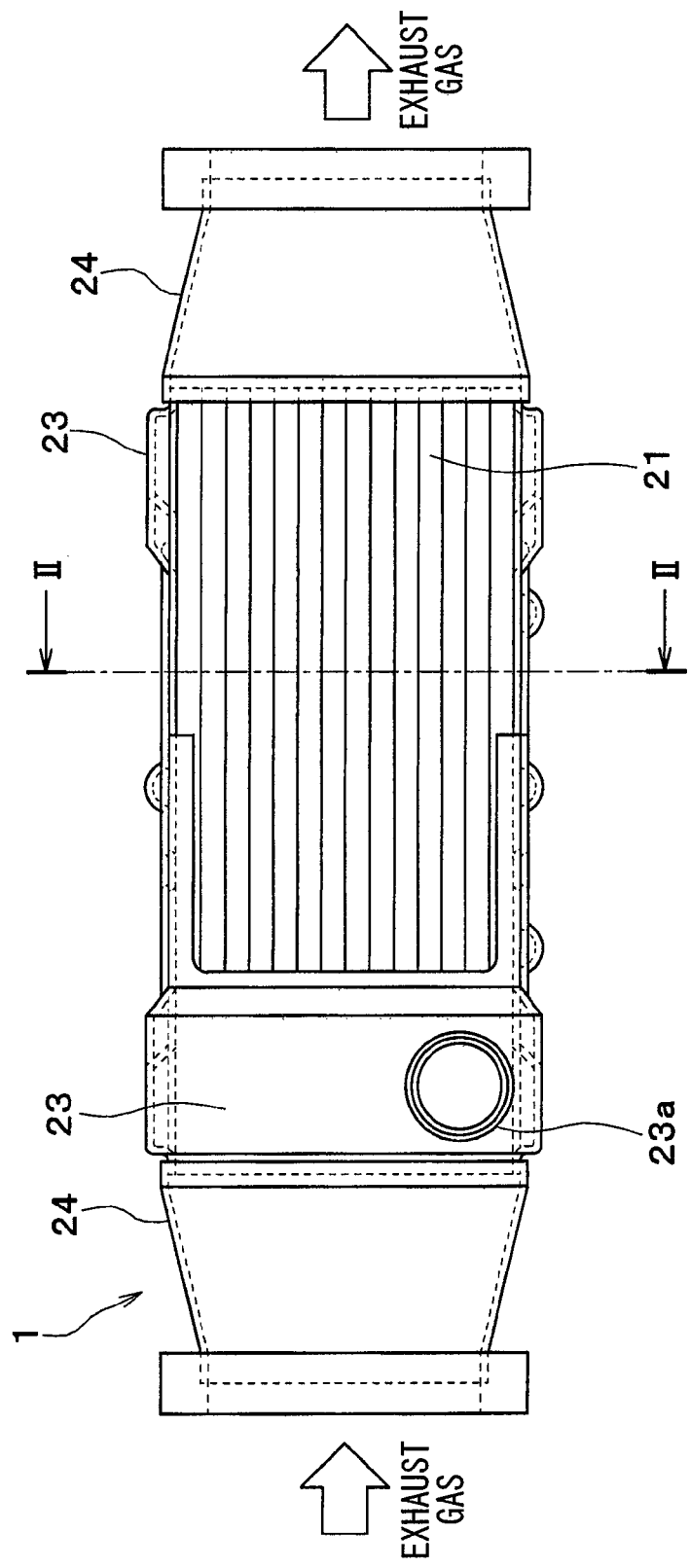
FIG. 1 is a side view illustrating an EGR cooler according to a first embodiment.

Embodiments are described with reference to the drawings. Same or equivalent portions among respective embodiments below are labeled with same reference numerals in the drawings.

First Embodiment

A first embodiment is described with reference to FIGS. 1-5. In the present embodiment, a heat exchanger according to the present disclosure is applied to an exhaust heat exchanger (EGR cooler).

Figure 2:
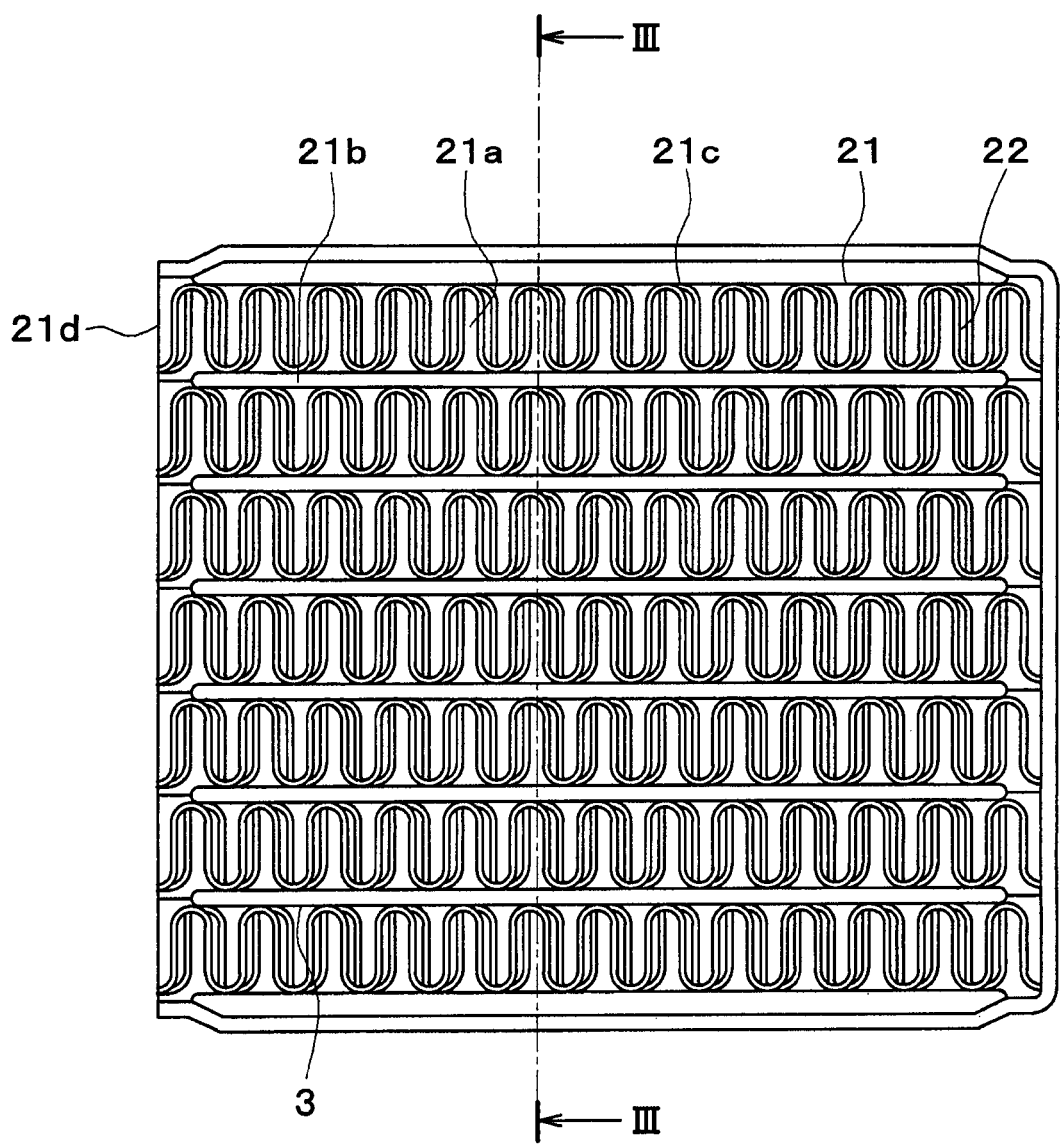
FIG. 2 is a cross-sectional view taken along a line II-II in FIG. 1.
Figure 3:
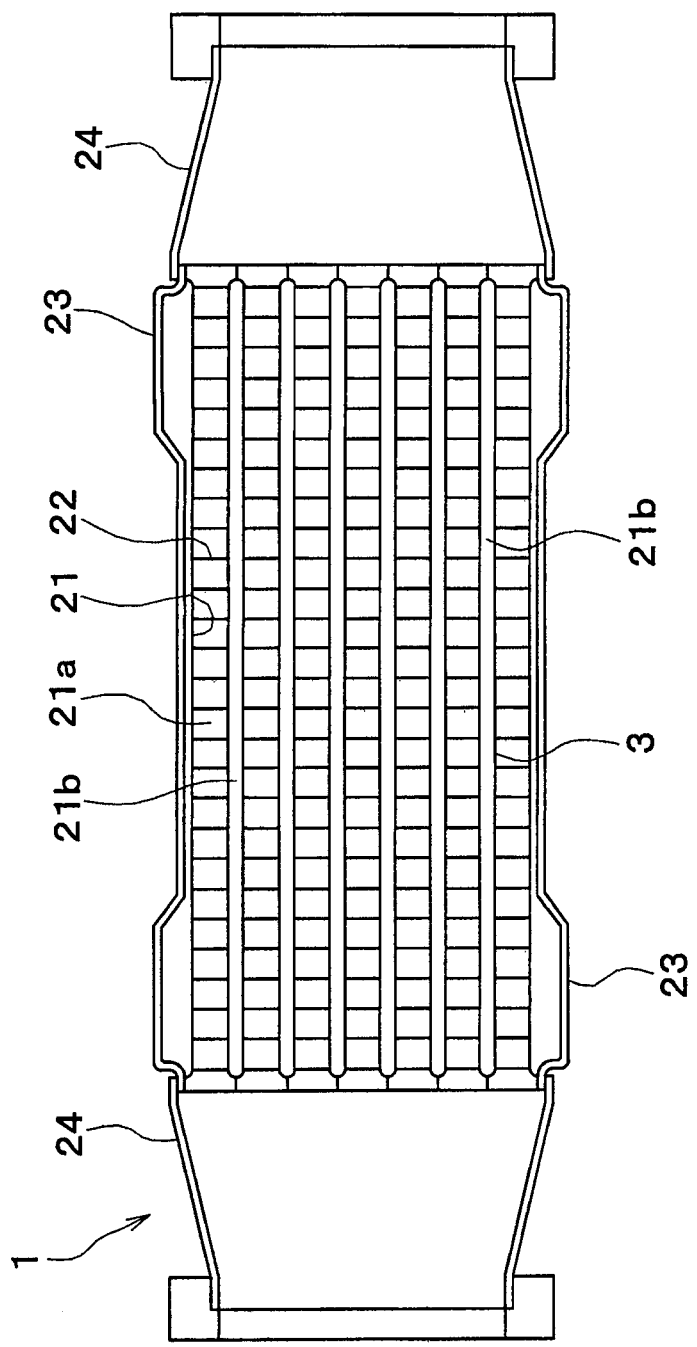
FIG. 3 is a cross-sectional view taken along a line III-III in FIG. 2.

An EGR cooler 1 is an exhaust gas heat exchanger. When exhaust gas generated by combustion in a non-illustrated internal combustion engine (engine) is recirculated to the engine, the exhaust gas is cooled by a cooling water (cooling medium) of the engine. As shown in FIGS. 1-3, the EGR cooler 1 includes plural tubes 21, an inner fin 22, a water tank 23, and an exhaust tank 24. These members 21 to 24 are made of an aluminum alloy, and are joined by brazing.

As shown in FIG. 2 and FIG. 3, the tube 21 is a pipe configuring an exhaust path 21a along which exhaust gas flows, and the exhaust gas flows through the interior of the tube 21. Cooling water flows along the exterior of the tube 21, and the exhaust gas and the cooling water are caused to exchange heat via the tube 21.

Specifically, as shown in FIG. 2, a sectional form of the tube 21 when seen in the flowing direction of the exhaust gas is a flat shape having a long side 21c and a short side 21d. The multiple tubes 21 are stacked in a direction (the up-down direction in the drawing) perpendicular to the flat surface corresponding to the long side 21c. As shown in FIG. 2 and FIG. 3, in this embodiment, basically, a cooling water path 21b is configured by the external walls of the neighboring tubes 21, and the cooling water flows along the cooling water path 21b between the neighboring tubes 21.

The water tank 23 has one tank 23 that distributes and supplies cooling water flowing into the EGR cooler 1 to each cooling water path 21b and the other tank 23 that collects and gathers the cooling water flowing from each cooling water path 21b. The water tank 23 is provided on the periphery of the stacked tubes 21, in the vicinity of either end portion of the tube 21 in the flowing direction of the exhaust gas. The water tank 23 includes a cooling water inlet (not shown) or a cooling water outlet 23a.

The exhaust tank 24 is disposed on either end portion of the tube 21 in the flowing direction of the exhaust gas. One exhaust tank 24 distributes and supplies exhaust gas to each tube 21, and the other exhaust tank 24 collects and gathers exhaust gas from each tube 21 after heat exchange is finished.

The inner fin 22 is disposed inside each tube 21, and promotes exchange of heat between the exhaust gas and the cooling water. The inner fin 22 is joined by brazing to the inner surface of the tube 21. Hereafter, a detailed configuration of the inner fin 22 will be described.

Figure 4:
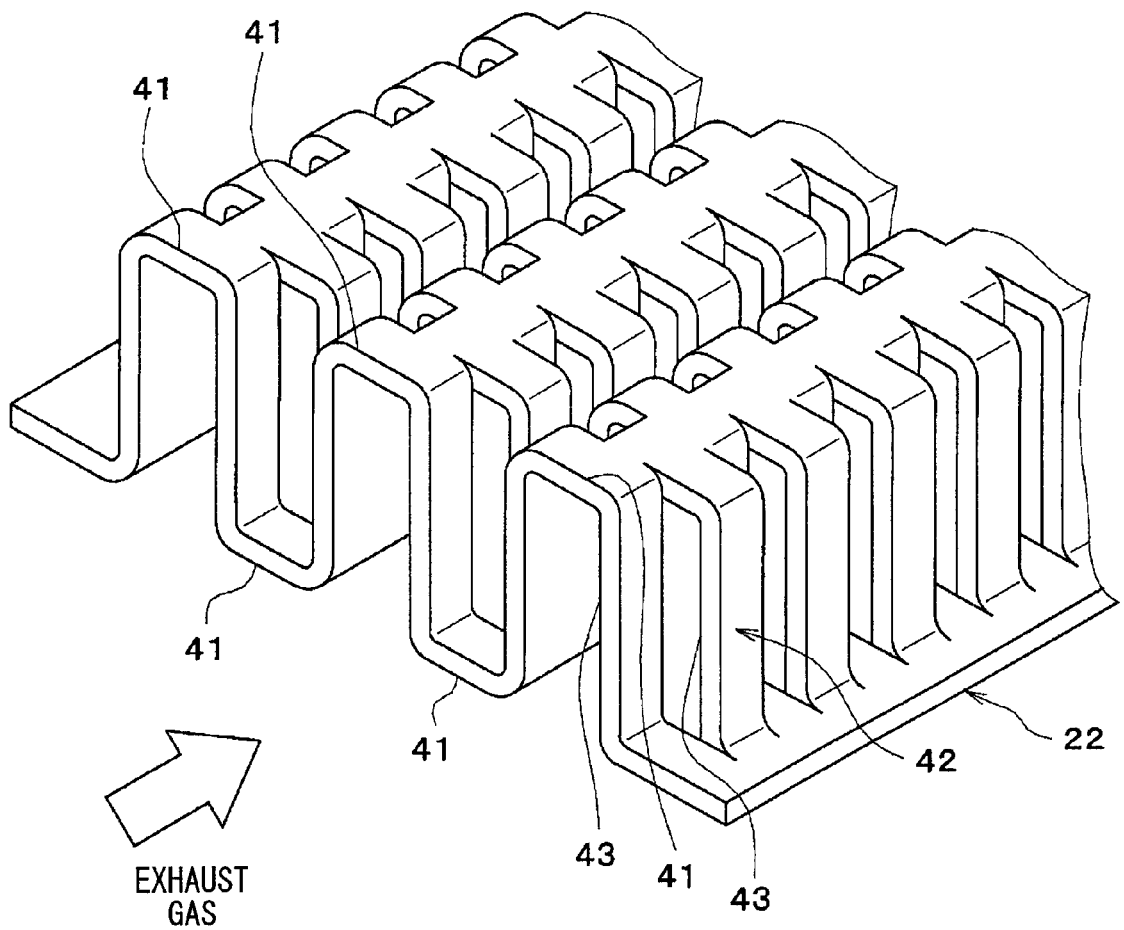
FIG. 4 is a perspective view illustrating an inner fin of the first embodiment.

As shown in FIG. 4, the inner fin 22 has a sectional form approximately perpendicular to the flowing direction of the exhaust gas, that is, a sectional form when seen in the flowing direction of the exhaust gas, in which a curving wave form is defined by protruding portions 41 alternately positioned on one side and the other side. The inner fin 22 includes a cut and raised portion 42 partially cut and raised in the flowing direction of the exhaust gas. The inner fin 22 is an offset fin, when seen from the flowing direction of the exhaust gas, in which a wave form portion formed by the cut and raised portion 42 is offset with respect to an adjacent wave form portion in the flowing direction of the exhaust gas. The protruding portion 41 of the inner fin 22 is in contact with the inner surface of the long side 21c of the tube 21.

As shown in FIG. 2, the exhaust path 21a is divided and partitioned by the inner fin 22 into a multiple of paths in a direction parallel to the long side 21c of the tube 21. Furthermore, the divided paths divided inside the tube 21 by the inner fin 22 are partially offset in the flowing direction of the exhaust gas. That is, as shown in FIG. 4, a wall portion 43 that divides the exhaust path 21a into a multiple of paths is arranged in the flowing direction of the exhaust gas, in the staggered configuration.

When seeing the inner fin 22 from the flowing direction of the exhaust gas, the protruding portions 41 on the same side, on one side or the other side, and neighboring in the flowing direction of the exhaust gas are disposed offset. In this embodiment, the sectional form of the inner fin 22 in the flowing direction of the exhaust gas includes a straight portion in the apex of the protruding portion 41. The inner fin 22 is manufactured by a flat plate made of an aluminum alloy being bent into a wave form by pressing, and furthermore, a portion that is to form the cut and raised portion 42 being raised by pressing.

A detailed configuration of the tube 21 and the inner fin 22 in this embodiment will be described, based on FIG. 5. The tube 21 and the inner fin 22 correspond to heat exchanger components of the disclosure.

The tube 21 and the inner fin 22 have a core member 20 made of an aluminum alloy. A film 30 formed by atomic layer deposition (ALD) is provided on a surface (the surface in contact with the exhaust gas) of the core member 20. The electric potential of the film 30 is nobler than that of the core member 20. In this embodiment, the film 30 is made of $TiO_2$.

The film 30 is formed evenly on the surface of the core member 20. Specifically, the ratio of the difference between the thickness of the thickest portion of the film 30 and the thickness of the thinnest portion of the film 30 with respect to the average thickness of the film is, for example, 15% or less, and preferably 10% or less. The average thickness of the film 30 is of nanometer order (1 nm to 100 nm).

A method of manufacturing the EGR cooler 1 of this embodiment will be described.

Firstly, an assembly step of assembling the components of the EGR cooler 1 is carried out. Specifically, after a tube stack is temporarily assembled by loading the inner fin 22 inside the multiple of tubes 21 disposed stacked, the water tank 23 and the exhaust tank 24 are assembled on the tube stack. By so doing, temporary fixing (temporary assembly) of the tube 21, the inner fin 22, the water tank 23, and the exhaust tank 24 is completed.

Next, a brazing step of joining by brazing the components of the EGR cooler 1 temporarily assembled in the assembly step is carried out. Specifically, the temporary assembly is conveyed into a heating furnace, and the tube stack (that is, the tube 21 and the inner fin 22), the water tank 23, and the exhaust tank 24 are integrally joined by brazing.

Next, a film formation step of forming the film 30 on the inner surface of the components of the EGR cooler 1 joined by brazing in the brazing step is carried out. Specifically, the film 30 is formed by atomic layer deposition on the inner wall surface of the tube 21 and the surface of the inner fin 22 by causing a coating material to flow through the interior of the EGR cooler 1, that is, the interior of the tube 21.

The occurrence of a through hole due to corrosion in the tube 21 and the inner fin 22 can be restricted by the film 30 formed on the surfaces of the tube 21 and the inner fin 22, which are heat exchanger components. Specifically, due to the film 30 with a potential nobler than that of the core member 20 of the tube 21 and the inner fin 22, the core member 20 can be prevented from corroding.

At this time, the film formation step is carried out after the brazing step. Therefore, the film 30 can be prevented from melting when brazing. Furthermore, due to the film 30 formed on the surfaces of the tube 21 and the inner fin 22 using a chemical vapor deposition method, which is one kind of dry coating method, blocking can be prevented from occurring in a minute portion (of the inner fin 22) in the heat exchanger when carrying out the film formation step. Consequently, the occurrence of a through hole due to corrosion in the tube 21 and the inner fin 22 can be reliably restricted.

According to the embodiment, the film 30 is formed by atomic layer deposition on the inner wall surface of the tube 21 and the surface of the inner fin 22 by causing a coating material to flow through the interior of the EGR cooler 1 (the interior of the tube 21) in the film formation step. Accordingly, the film 30 can be formed on the inner wall surface of the tube 21 and the surface of the inner fin 22, which are the interior of the product, by using the EGR cooler 1, which is the product, as a chamber. Thus, the film formation step can be realized using a simple method.

Second Embodiment

A second embodiment of the disclosure will be described, based on FIG. 6. In the second embodiment, a film 30 formed on the surface of a core member 20 of a tube 21 and an inner fin 22 has a potential less noble than that of the core member 20. In this embodiment, the film 30 is made of $Al_2O_3$.

Because of this, the corrosion resistance of the core member 20 is relatively high with respect to the film 30. Therefore, the film 30 performs a sacrificial corrosion action with respect to the core member 20, such that the core member 20 can be prevented from corroding.

Figure 6:
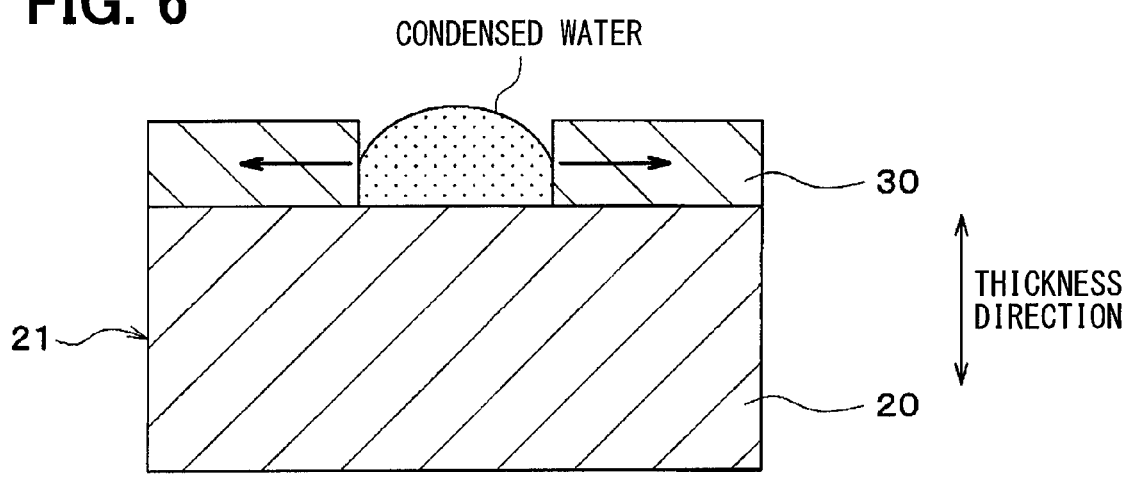
FIG. 6 is an enlarged cross-sectional view illustrating a tube according to a second embodiment.

As shown in FIG. 6, even in a case where a through hole is generated in the film 30 by corrosion due to an adhesion of condensed water, corrosion of the film 30 advances in a direction (the arrow directions in FIG. 6) parallel to the plate surface of the core member 20, such that the corrosion can be restricted from advancing in the thickness direction of the core member 20.

Third Embodiment

Figure 7:
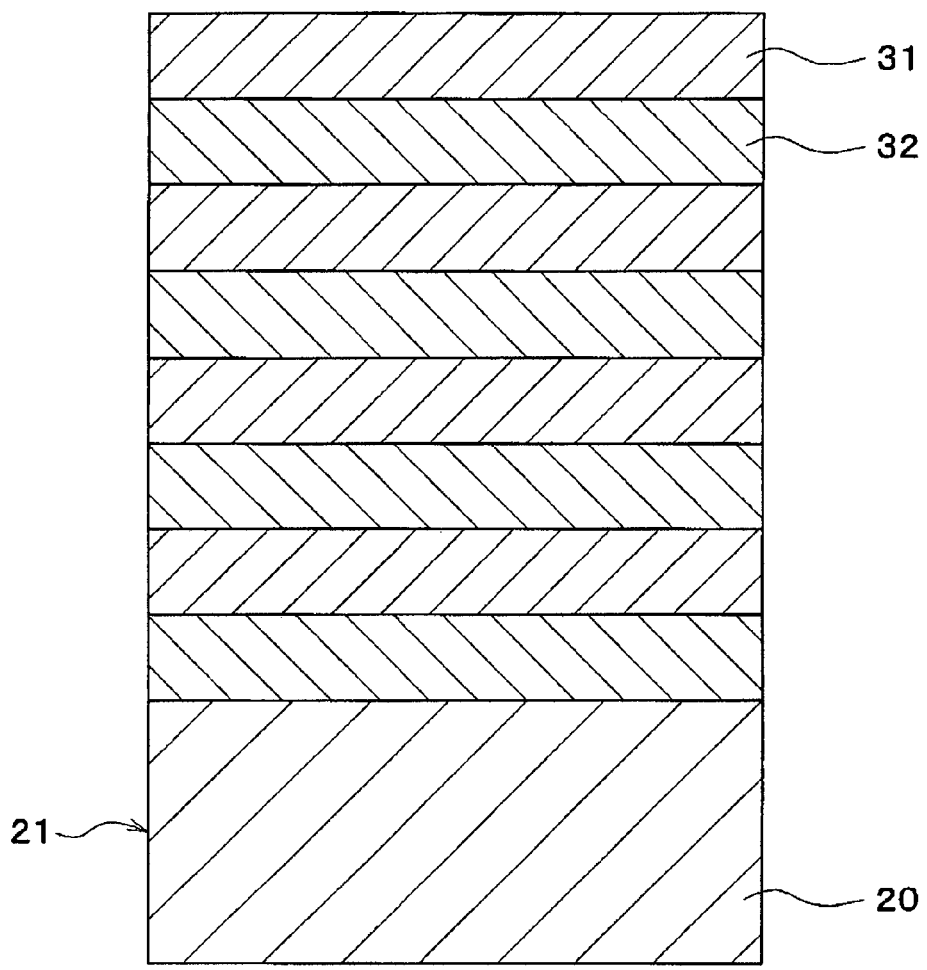
FIG. 7 is an enlarged cross-sectional view illustrating a tube according to a third embodiment.

A third embodiment of the disclosure will be described, based on FIG. 7. In the third embodiment, a first corrosion-resistant film 31 and a second corrosion-resistant film 32 having potentials more noble than that of the core member 20 are alternately stacked on the surface of a core member 20 of a tube 21 and an inner fin 22, as shown in FIG. 7.

Each of the first corrosion-resistant film 31 and the second corrosion-resistant film 32 is formed by atomic layer deposition. Also, the first corrosion-resistant film 31 and the second corrosion-resistant film 32 are formed in a crystalline state. In this embodiment, the first corrosion-resistant film 31 is made of $TiO_2$, and the second corrosion-resistant film 32 is made of $Cr_2O_3$.

The occurrence of a through hole due to corrosion in the core member 20 can be reliably restricted by alternately stacking the two kinds of corrosion-resistant films 31 and 32 on the surface of the core member 20 of the tube 21 and the inner fin 22.

Fourth Embodiment

Figure 8:
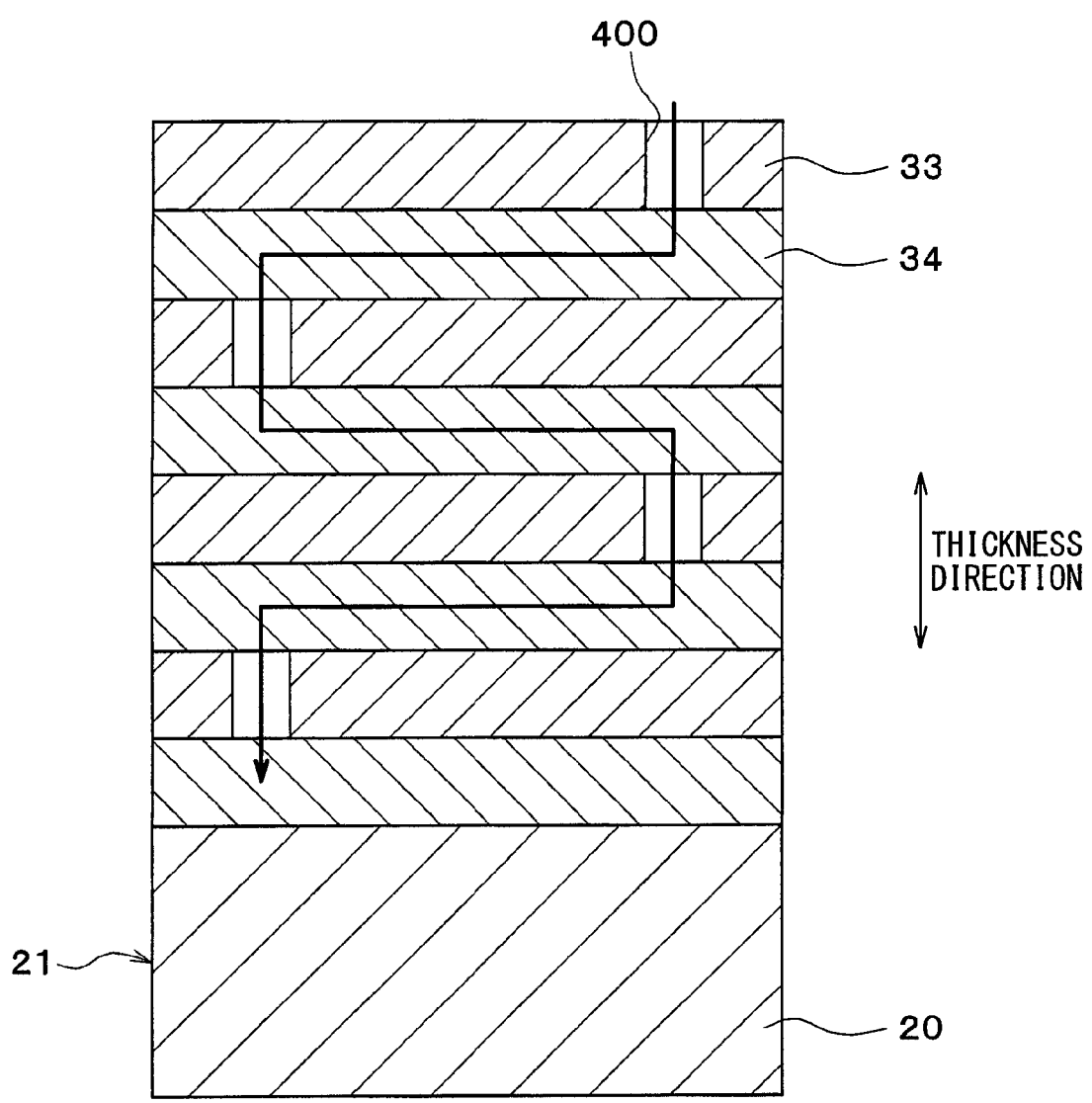
FIG. 8 is an enlarged cross-sectional view illustrating a tube according to a fourth embodiment.

A fourth embodiment of the disclosure will be described, based on FIG. 8. In the fourth embodiment, as shown in FIG. 8, a corrosion-resistant film 33, which is in a crystalline state and has a potential more noble than that of a core member 20, and a sacrifice film 34, which is in an amorphous state and has a potential less noble than that of the core member 20, are alternately stacked on the surface of the core member 20 of a tube 21 and an inner fin 22. Each of the corrosion-resistant film 33 and the sacrifice film 34 is formed by atomic layer deposition.

The corrosion-resistant film 33 and the sacrifice film 34 are oxide films (preferably passivation films). Specifically, each of the corrosion-resistant film 33 and the sacrifice film 34 is made of at least one kind selected from $Al_2O_3$, $TiO_2$, and $Cr_2O_3$. In this embodiment, the corrosion-resistant film 33 is made of $TiO_2$, and the sacrifice film 34 is made of $Al_2O_3$.

Even in a case where a pinhole 400 is generated in the corrosion-resistant film 33 by corrosion, corrosion in the sacrifice film 34 advances in a direction parallel to the plate surface of the core member 20 by alternately stacking the corrosion-resistant film 33 and the sacrifice film 34 on the surface of the core member 20 of the tube 21 and the inner fin 22. Further, the corrosion does not advance to the next corrosion-resistant film 33 until the sacrifice film 34 becomes detached and falls off due to corrosion. That is, the corrosion advances as shown by an arrow in FIG. 8. Therefore, the corrosion can be delayed from reaching the core member 20 in comparison with when there is only the corrosion-resistant film 33 or when there is only the sacrifice film 34. Consequently, the occurrence of a through hole due to corrosion in the core member 20 can be more reliably restricted.

In case where only a crystalline-state film is formed on the surface of the core member 20, there is concern that condensed water will infiltrate the gaps between the crystals configuring the film, and that the condensed water will reach the core member 20, whereby the core member 20 will corrode.

In contrast, according to the present embodiment, the corrosion-resistant film 33 is formed in a crystalline state, and the sacrifice film 34 is formed in an amorphous state. Because of this, even assuming that condensed water infiltrates the gaps between the crystals configuring the corrosion-resistant film 33, the condensed water can be prevented from reaching the core member 20 because the amorphous-state sacrifice film 34 is disposed between the corrosion-resistant film 33 and the core member 20.

Fifth Embodiment

A fifth embodiment of the disclosure will be described, based on FIG. 9 and FIG. 10. The fifth embodiment differs from the first embodiment in that no brazing step is included in a heat exchanger manufacturing process, that is, a tube is mechanically fixed rather than being joined by brazing to a fin or the like. In this embodiment, the heat exchanger of the disclosure is applied to a radiator 100 that cools a cooling water of an engine (internal combustion engine) by exchanging heat between the cooling water and air.

Figure 9:
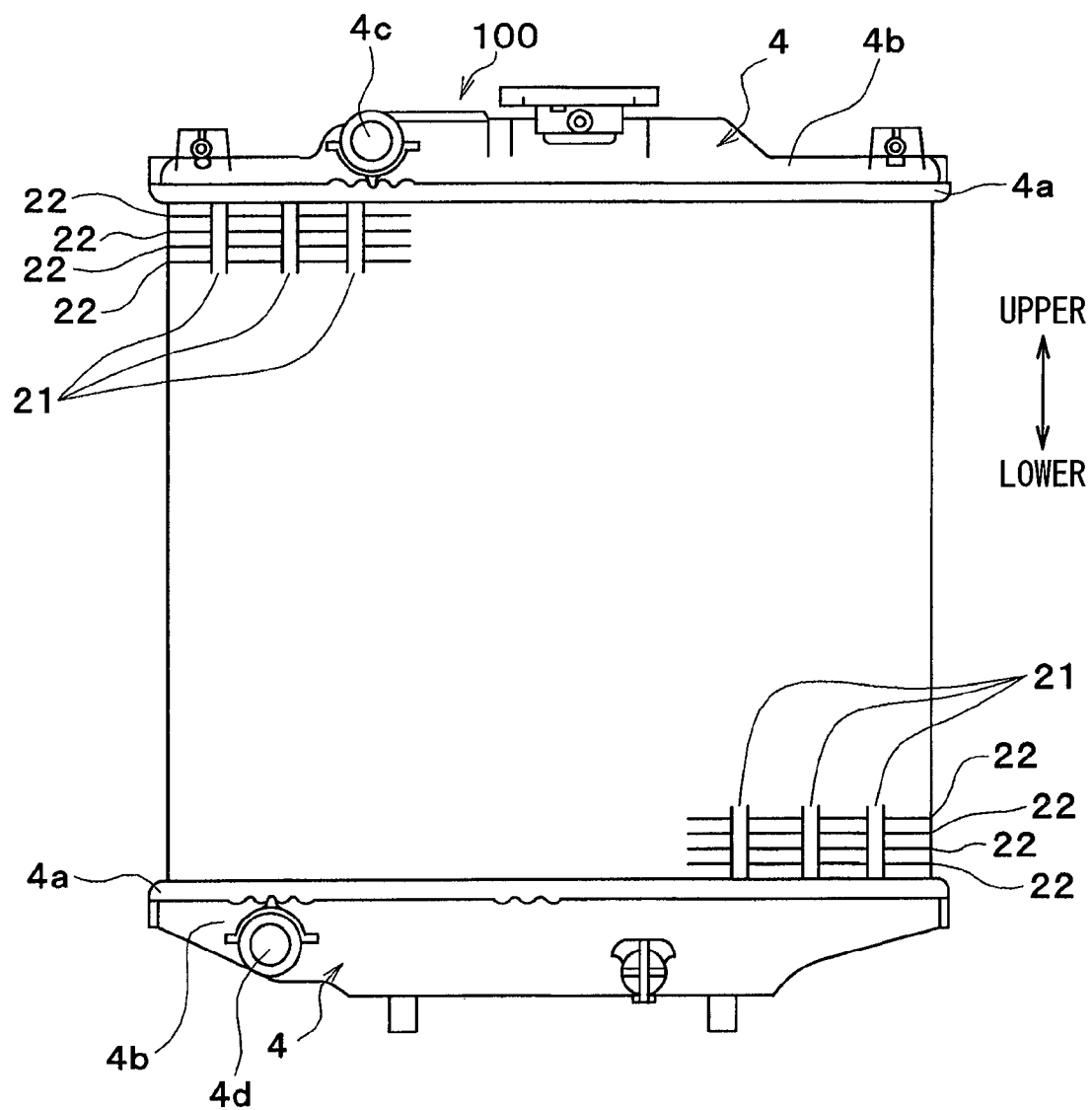
FIG. 9 is a front view illustrating a radiator according to a fifth embodiment.
Figure 10:
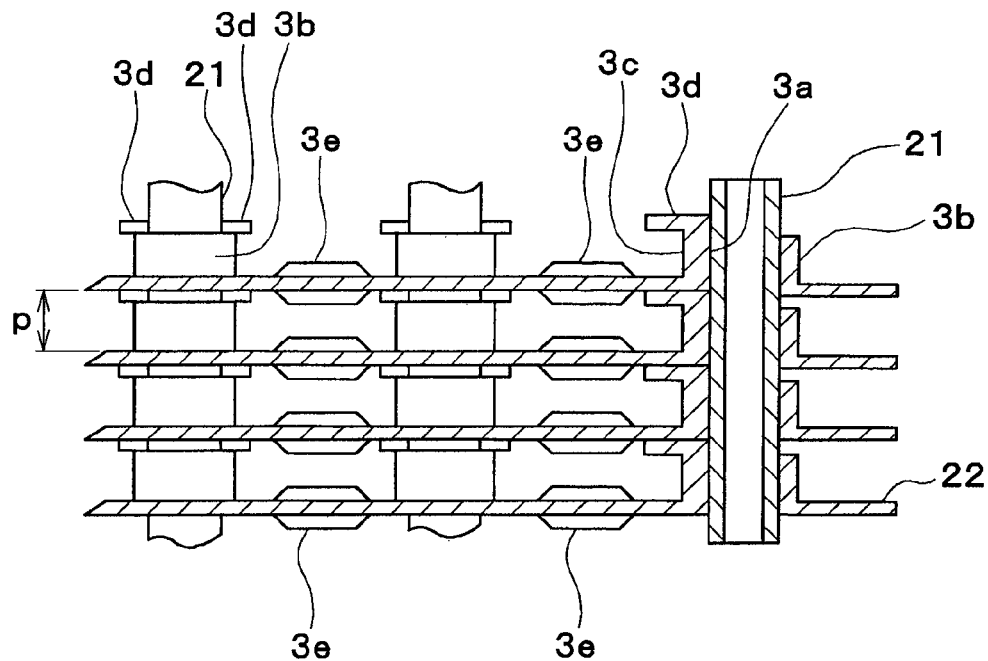
FIG. 10 is an enlarged cross-sectional view illustrating a tube of the fifth embodiment.

In FIG. 9, a tube 21 is a metal (for example, aluminum alloy) pipe through which a cooling water flows. In this embodiment, a welded pipe (electric resistance welded pipe) having a flat sectional form is employed as the tube 21, in which a plate material is bent to have a flat (elliptical) pipe form before being joined by welding. Multiple plate-form fins 22 are connected to the tube 21. Details of the fin 22 will be described hereafter.

A tank 4 communicates with the tubes 21 at the longitudinal end portion of the tube 21. The tank 4 on the upper side in the drawing distributes and supplies engine cooling water to each tube 21, and the tank 4 on the lower side in the drawing collects and recovers engine cooling water after an exchange of heat with the air is finished.

The tank 4 according to this embodiment has a metal core plate 4a to which the tube 21 is fixed, a resin tank main body 4b that together with the core plate 4a configures a space inside the tank, and the like. The core plate 4a has multiple insertion holes (not shown) through which the tube 21 is inserted. The core plate 4a and the tank main body 4b are liquid-tightly fixed by plastically deforming via a seal member such as rubber packing.

A cooling water inlet 4c and a cooling water outlet 4d are provided in the tank main body 4b. The cooling water inlet 4c is connected to a cooling water outlet side of the engine. The cooling water outlet 4d is connected to a cooling water inlet side of the engine.

The fin 22 is a metal (for example, an aluminum alloy) thin strip plate, spreading in a direction perpendicular to the longitudinal direction (the up-down direction in FIG. 9) of the tube 21 and extending in strip form in the lateral direction of the tube 21, that promotes an exchange of heat with the cooling water. As shown in FIG. 10, the fin 22 has an insertion hole 3a into which the tube 21 is inserted so as to penetrate the fin 22. The fin 22 has a louver 3e defined by cutting and raising one portion of the fin 22 into a louver form, thereby deflecting air flowing around the fin 22 and restricting the growth of a temperature boundary layer. The insertion hole 3a and the louver 3e are formed by, for example, performing a pressing process on the fin 22.

In this embodiment, the dimension of the insertion hole 3a is smaller than the external dimension of the tube 21 when the insertion hole 3a is formed by pressing or the like, that is, in a state before the tube 21 is inserted. Further, the dimension of the insertion hole 3a is increased by performing a burring process on the insertion hole 3a so as to be practically the same as the external dimension of the tube 21. Thus, an approximately tubular burred portion 3b that comes into contact with the outer wall of the tube 21 is provided in an edge portion of the insertion hole 3a.

The burred portion 3b comes into contact with practically the whole of the outer periphery of the tube 21 along the outer peripheral surface of the tube 21. By expanding the tube 21 using a tube expansion jig or the like in a state where the tube 21 is inserted in the insertion hole 3a, the outer peripheral surface of the tube 21 and the burred portion 3b are brought into pressure contact at a surface pressure greater than or equal to a predetermined surface pressure, thereby mechanically joining the fin 22 and the tube 21.

Multiple (two in this embodiment) protruding portions 3c are provided in an edge portion of the insertion hole 3a in order to make contact with neighboring fins 22 protruding from the edge portion. The protruding portion 3c is molded simultaneously with the insertion hole 3a when punching a region of the fin 22 corresponding to the insertion hole 3a.

The distal end of the protruding portion 3c is bent upward approximately 90° before the burring process. Thereafter, the base side of the protruding portion 3c is bent approximately 90° simultaneously with the burring process so as to be practically parallel to the longitudinal direction of the tube 21. Further, a bent portion 3d provided on the distal end of the protruding portion 3c comes into contact with the neighboring fin 22, such that a pitch dimension p between the neighboring fins 22 is maintained.

Figure 5:
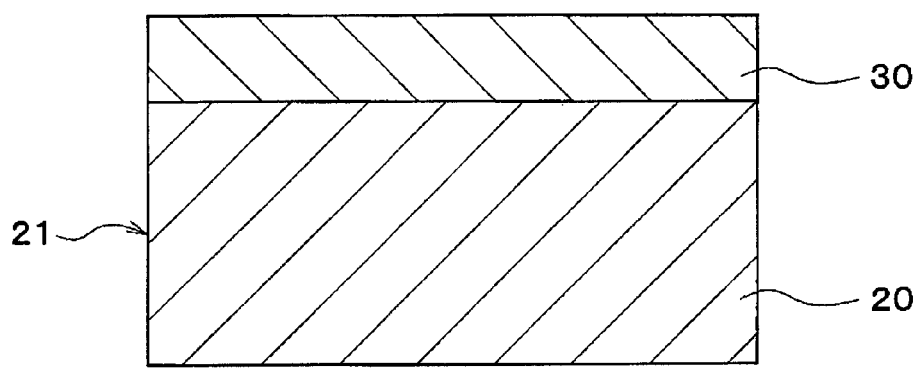
FIG. 5 is an enlarged cross-sectional view illustrating a tube of the first embodiment.

Herein, in the same way as in the first embodiment, the tube 21 and the fin 22 have a core member 20 made of an aluminum alloy (refer to FIG. 5 of the first embodiment). A film 30 (refer to FIG. 5 of the first embodiment) formed by atomic layer deposition (ALD) is provided on a surface (the surface in contact with the air) of the core member 20. The electric potential of the film 30 is nobler than that of the core member 20. In this example, the film 30 is made of $TiO_2$.

A method of manufacturing the radiator 100 of this embodiment will be described.

Firstly, an assembly step of assembling the components of the radiator 100 is carried out. Specifically, the tube 21 is inserted into the insertion holes 3a of the fins 22 disposed stacked, and into the insertion hole formed in the core plate 4a. Subsequently, the tube 21 is mechanically joined to the fin 22 and the core plate 4a by expanding the tube 21 using a tube expansion jig. Subsequently, the tank main body 4b is assembled on the core plate 4a. By so doing, the fixing (assembly) of the tube 21, the fin 22, and the tank 4 is completed.

Next, a film formation step of forming the film 30 on the surface of the components of the radiator 100 assembled in the assembly step is carried out. Specifically, the film 30 is formed by atomic layer deposition on the surfaces of the tube 21 and the inner fin 22.

The film 30 is formed on the surfaces of the tube 21 and the inner fin 22, which are heat exchanger components, such that the occurrence of a through hole due to corrosion in the tube 21 and the inner fin 22 can be restricted by the film 30.

As the film formation step is carried out after the assembly step, the film 30 can be prevented from being damaged when conveying the components or when assembling the components. Consequently, the occurrence of a through hole due to corrosion in the tube 21 and the inner fin 22 can be reliably restricted.

Other Embodiment

The disclosure, not being limited by the heretofore described embodiments, can be variously changed in the following ways without departing from the scope of the disclosure.

In the third embodiment, both a first corrosion-resistant film 31 and a second corrosion-resistant film 32 are formed in a crystalline state, but this is not limiting. For example, the first corrosion-resistant film 31 may be formed in a crystalline state while the second corrosion-resistant film 32 is formed in an amorphous state. Also, both the first corrosion-resistant film 31 and the second corrosion-resistant film 32 may be formed in an amorphous state.

Figure 11:
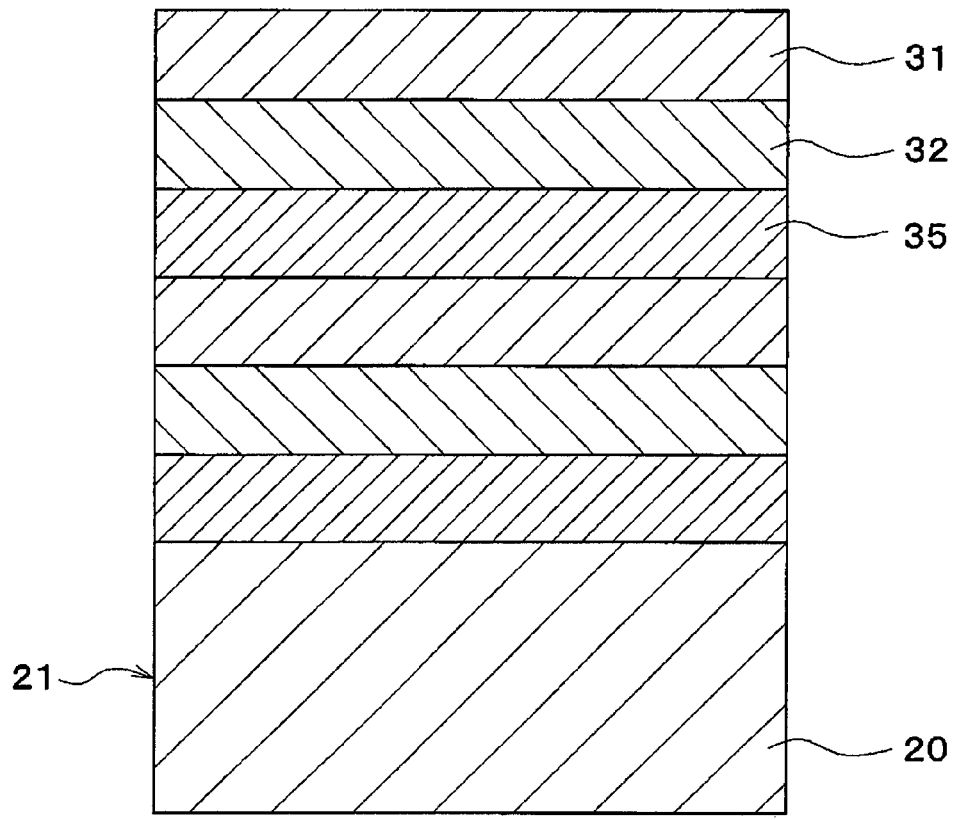
FIG. 11 is an enlarged cross-sectional view illustrating a tube according to other embodiment.

In the third and fourth embodiments, two kinds of films 31 to 34 are alternately stacked on the surface of a core member 20 of a tube 21 and an inner fin 22 but, this not being limiting. Alternatively, three or more kinds of films may be stacked sequentially on the surface of the core member 20. For example, as shown in FIG. 11, a first corrosion-resistant film 31, a second corrosion-resistant film 32, and a third corrosion-resistant film 35 may be stacked sequentially on the surface of the core member 20.

In the above embodiments, the films 30 to 35 are formed on the surface of a core member 20 of a tube 21 and an inner fin 22, but the regions on which the films 30 to 35 are formed are not limited to these. For example, the films 30 to 35 may be formed on the surfaces of regions of the heat exchanger components configured by different metals being joined. As a region in which different metals are joined corrodes easily, the corrosion resistance of a region that corrodes easily can be increased by forming the films 30 to 35 on the surface of the region.

In the above embodiments, the atomic layer deposition is employed as a film formation method whereby films 30 to 35 are formed on the surface of a core member 20 of a tube 21 and an inner fin 22, but the film formation method is not limited to this. For example, another chemical vapor deposition (CVD) method, such as plasma CVD, photo-CVD, or thermal CVD, may be employed.

In the above embodiments, an aluminum alloy is employed as a core member 20 of a tube 21 and an inner fin 22. Alternatively, stainless steel, for example, may be employed.

Figure 12:
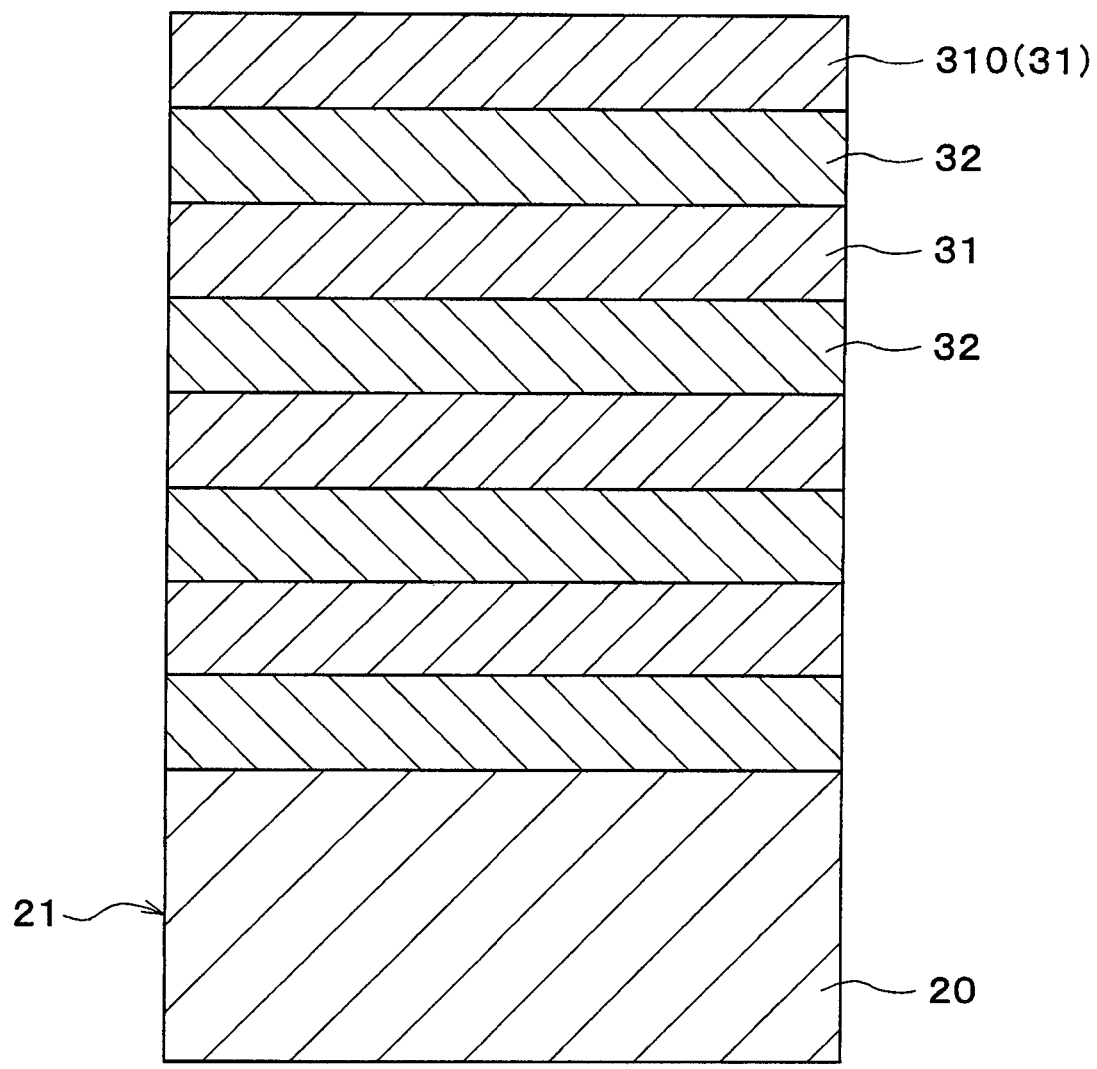
FIG. 12 is an enlarged cross-sectional view illustrating a tube according to other embodiment.

In the third embodiment, two kinds of corrosion-resistant film 31 and 32 are alternately stacked on the surface of a core member 20 of a tube 21 and an inner fin 22, but this is not limiting. For example, as shown in FIG. 12, an outermost layer film 310 positioned on the outermost side of the two kinds of corrosion-resistant film 31 and 32 may be configured to have a potential nobler than that of the corrosion-resistant film 32 positioned inward from the outermost layer film 310 and in contact with the outermost layer film 310. In other words, of the two kinds of corrosion-resistant film 31 and 32, the film 31 having the nobler potential may be disposed on the outermost side.

One kind selected from a molybdenum oxide, a tantalum oxide, a niobium oxide, a tungsten oxide, a zirconium oxide, or a titanium oxide is used as the outermost layer film 310 (the corrosion-resistant film 31, which has the nobler potential).

Figure 13:
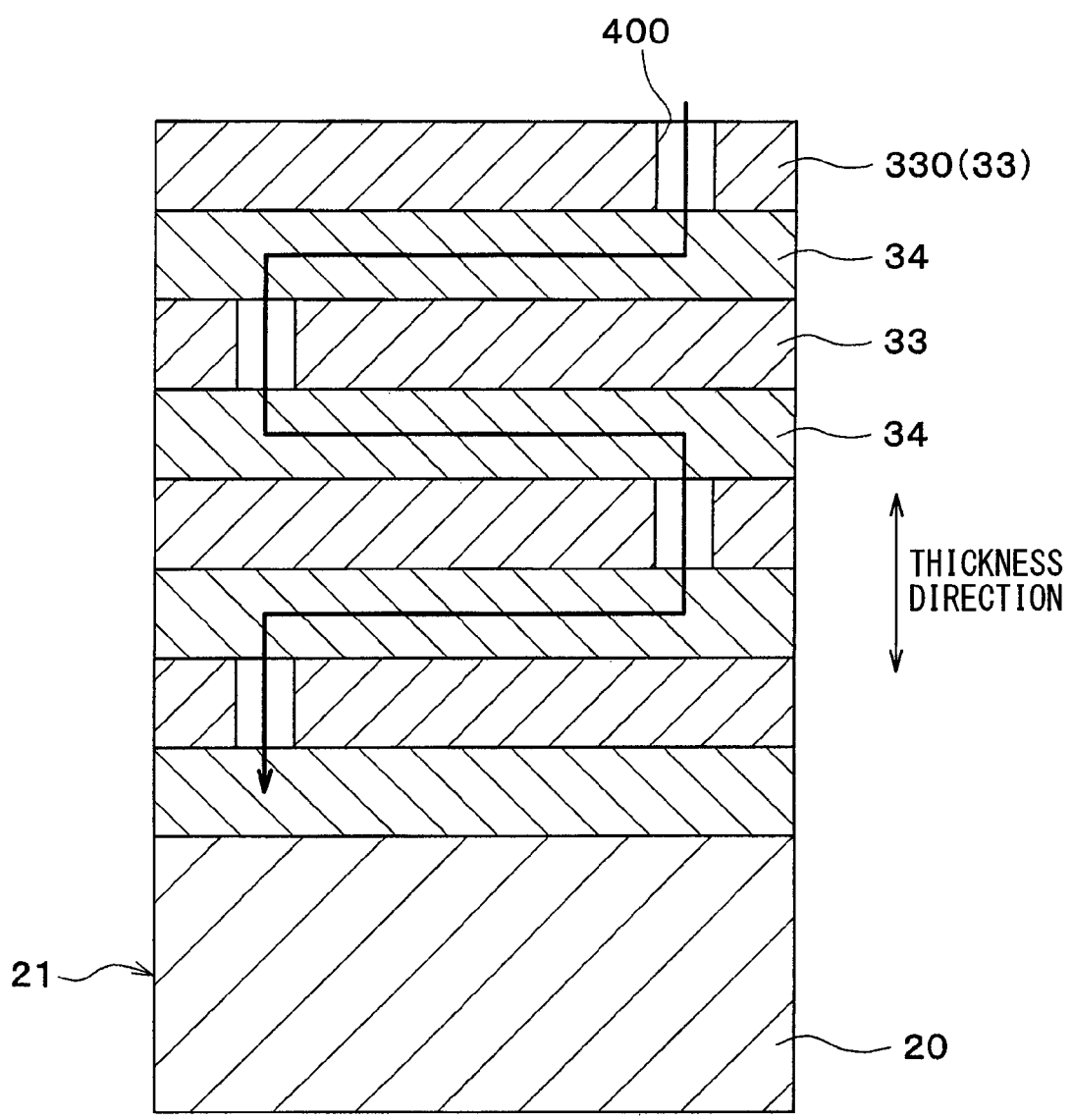
FIG. 13 is an enlarged cross-sectional view illustrating a tube according to other embodiment.

In the fourth embodiment, a corrosion-resistant film 33 and a sacrifice film 34 are alternately stacked on the surface of a core member 20 of a tube 21 and an inner fin 22, but this is not limiting. For example, as shown in FIG. 13, an outermost layer film 330 positioned on the outermost side of the corrosion-resistant film 33 and the sacrifice film 34 may be configured to have a potential nobler than that of the film 34 positioned inward from the outermost layer film 330 and in contact with the outermost layer film 330. In other words, of the corrosion-resistant film 33 and the sacrifice film 34, the film 33 having the nobler potential may be disposed on the outermost side.

One kind selected from a molybdenum oxide, a tantalum oxide, a niobium oxide, a tungsten oxide, a zirconium oxide, or a titanium oxide is used as the outermost layer film 330 (the corrosion-resistant film 33, which has the nobler potential).

The above embodiments may be combined as appropriate within an implementable range. For example, the film 30 of the second embodiment (a film of a potential less noble than that of the core member 20) may be formed on the surfaces of the tube 21 and the fin 22 of the radiator 100 of the fifth embodiment.

As in the third embodiment, the first corrosion-resistant film 31 and the second corrosion-resistant film 32 may be alternately stacked on the surfaces of the tube 21 and the fin 22 of the radiator 100 of the fifth embodiment. As in the fourth embodiment, the corrosion-resistant film 33 and the sacrifice film 34 may be alternately stacked on the surfaces of the tube 21 and the fin 22 of the radiator 100 of the fifth embodiment.

The invention claimed is:

1. A method for manufacturing a heat exchanger, comprising:
    assembling a plurality of heat exchanger components in an assembly step; and
    forming a film on surfaces of the heat exchanger components using a chemical vapor deposition method in a film formation step after the assembly step, wherein
    the film includes a crystalline-state film and an amorphous-state film alternately stacked on the surfaces of the heat exchanger components,
    the crystalline-state film has a potential more noble than that of a material of the heat exchanger components, and
    the amorphous-state film has a potential less noble than that of the material of the heat exchanger components.

2. The method for manufacturing a heat exchanger according to claim 1, further comprising:
    brazing the plurality of heat exchanger components in a brazing step after the assembly step, wherein
    the film formation step is carried out after the brazing step.

3. The method for manufacturing a heat exchanger according to claim 1, wherein the chemical vapor deposition method is atomic layer deposition.

4. A method for manufacturing a heat exchanger, comprising:
    assembling a plurality of heat exchanger components in an assembly step; and
    forming a film on surfaces of the heat exchanger components using a chemical vapor deposition method in a film formation step after the assembly step, wherein
    the film includes a crystalline-state film and an amorphous-state film alternately stacked on the surfaces of the heat exchanger components, and
    the crystalline-state film and the amorphous-state film have potentials nobler more noble than that of a material of the heat exchanger components.

5. The method for manufacturing a heat exchanger according to claim 4, further comprising:
    brazing the plurality of heat exchanger components in a brazing step after the assembly step, wherein
    the film formation step is carried out after the brazing step.

6. The method for manufacturing a heat exchanger according to claim 4, wherein the chemical vapor deposition method is atomic layer deposition.

* * * * *